(12) United States Patent
Parker et al.

(10) Patent No.: US 6,785,856 B1
(45) Date of Patent: Aug. 31, 2004

(54) INTERNAL SELF-TEST CIRCUIT FOR A MEMORY ARRAY

(75) Inventors: Allan Parker, Austin, TX (US); Joseph Skrovan, Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 459 days.

(21) Appl. No.: 09/732,616

(22) Filed: Dec. 7, 2000

(51) Int. Cl.[7] .............................................. G01R 31/28
(52) U.S. Cl. ..................................................... 714/734
(58) Field of Search ............................... 714/718–720, 714/728, 733–734, 738, 739, 753; 365/200; 324/73.1

(56) References Cited

U.S. PATENT DOCUMENTS

| | | | | |
|---|---|---|---|---|
| 4,939,694 A | * | 7/1990 | Eaton et al. ................. 365/200 |
| 5,101,409 A | * | 3/1992 | Hack ........................... 714/720 |
| 5,875,153 A | * | 2/1999 | Hii et al. ..................... 365/233 |
| 5,909,334 A | | 6/1999 | Barr et al. ..................... 360/53 |
| 5,996,105 A | | 11/1999 | Zook ........................... 714/755 |
| 6,009,547 A | | 12/1999 | Jaquette ....................... 714/758 |
| 6,021,477 A | | 2/2000 | Mann ........................ 711/167 |
| 6,052,815 A | | 4/2000 | Zook ........................... 714/758 |
| 6,079,044 A | | 6/2000 | Cunningham et al. ....... 714/763 |
| 6,085,334 A | * | 7/2000 | Giles et al. ..................... 714/7 |
| 6,119,251 A | * | 9/2000 | Cloud et al. ................. 714/718 |

* cited by examiner

*Primary Examiner*—Albert Decady
*Assistant Examiner*—Shelly A Chase

(57) ABSTRACT

An integrated memory self-tester that tests an entire memory array reduces the need for sophisticated external test equipment and reduces the duration of the test. A read test of the memory array can check the memory cells. Optional programmable registers may store the results of the tests. The results may be transmitted from the memory device. The integrated memory self-tester may be initiated via a test signal, be self initiated periodically, or be initiated by other means.

45 Claims, 2 Drawing Sheets

INTERNAL SELF-TEST CIRCUIT FOR A MEMORY ARRAY

BACKGROUND

A memory cell may be a flash memory cell made of field effect transistors (FETs) that each include a select gate, a floating gate, a drain, and a source. Each memory cell may be read by grounding the source, and applying a voltage to a bitline connected with the drain. By applying a voltage to the wordline connected to the select gate, the cell can be switched "on" and "off." Each memory cell in an array of memory cells store a "1" or a "0." Multilevel cells can store more than a single bit of data.

Programming a cell includes trapping excess electrons in the floating gate to increase the voltage. This reduces the current conducted by the memory cell when the select voltage is applied to the select gate. The memory cell is programmed when the cell current is less than a reference current and the select voltage is applied. The cell is erased when the cell current is greater than the reference current and the select voltage is applied.

A memory array may include multiple pages that are individually accessible. For example, a memory array may contain 64 pages and each page may contain 1 KB of memory cells. Each memory cell may be accessed by making the page that contains the memory cell the active memory page, then accessing the memory cell by selecting the row and column in the memory page that corresponds to the memory cell. The latency of making a memory page active is generally much larger than the access time of a memory cell. For example the page latency may be 3 microseconds while the cell access time may be only 50 nanoseconds.

An error may occur in a memory cell due to internal defects, normal use over a long period of time, non-use for a long period of time, or other factors. Two of the primary data reliability issues for memory cells are the "data retention" effect and "read disturb" effect. The "data retention" effect is a shift in the stored voltage level toward the erase state that results from the normal passage of time. The "read disturb" effect is a shift in the stored voltage level that results from reading the memory cell. For the read disturb effect to be appreciable, many reads must occur. When the stored voltage level shifts too far in either direction, it will be interpreted as representing the next higher or lower voltage level and thus the data will be misread.

An error checking and correction (ECC) circuit detects and optionally corrects errors in a memory array. An ECC circuit typically partitions a memory page into groups of memory cells and checks each group of memory cells independently and then generates a syndrome that indicates which memory cells had errors in each group. For example, a page of memory with 1 KB of memory cells may have 64 groups each containing 16 bytes of memory cells. Based on the algorithm of the ECC circuit and the size of the group, the memory cells in the group can be corrected if the total number of errors in the group is below a threshold. An ECC circuit typically generates a syndrome for each group that indicates which memory cells have errors. A syndrome that contains all zeros indicates that no errors were detected. If the number of errors in a group exceeds the threshold, none of the errors can be repaired. For example, the maximum number of errors that can be corrected in a memory array may be:

$$\text{Max \# of errors} = \text{\# of pages} * \text{\# of groups} * \text{bits/group} \qquad \text{Eqn. 1}$$

Where:

Max # of errors is the maximum number of errors that can be corrected in the memory array.

# of pages is the number of pages in the memory array.

# of groups is the number of groups per page.

bits/group is the number of bits that can be repaired per group.

For the above example:

$$\text{Max \# of errors} = 64*64*16$$

$$= 1\text{KB} \qquad \text{Eqn. 2}$$

The reliability of a memory array is dependent on many factors, some of which are process-dependent. Therefore, it is desirable to periodically test memory arrays to ensure that the manufacturing processes is functioning properly. Currently, complex and expensive test equipment must be connected with the memory array to test the reliability of the memory array. Also, the external test equipment typically cause delays during testing. These delays significantly lengthen the testing period for tests such as "read disturb" tests.

BRIEF SUMMARY

An integrated memory self-tester that tests an entire memory array reduces the need for sophisticated external test equipment and reduces the duration of the test. A read test of the memory array can check the memory cells. Optional programmable registers may store the results of the tests. The results may be transmitted from the memory device. The integrated memory self-tester may be initiated via a test signal, be self initiated periodically, or be initiated by other means. The memory array may be tested using one or more of a variety of patterns including all ones, all zeros, or a pattern, such as a checkerboard pattern.

BRIEF DESCRIPTION OF THE DRAWINGS

The present invention is described with reference to the accompanying figures. In the figures, like reference numbers indicate identical or functionally similar elements. Additionally, the left-most digit(s) of a reference number identifies the figure in which the reference number first appears.

DETAILED DESCRIPTION

In order to reduce the complexity of external test equipment and speed up memory testing, it is desirable to have an integrated mechanism to automatically test a memory array. Because the memory array is unavailable for use during a test, it is important to complete the test as quickly as possible. Therefore an improved memory device has a built-in self-tester. A read test, which reads each memory cell and verifies the data in each memory cell is one of the quickest tests.

Figure 1:
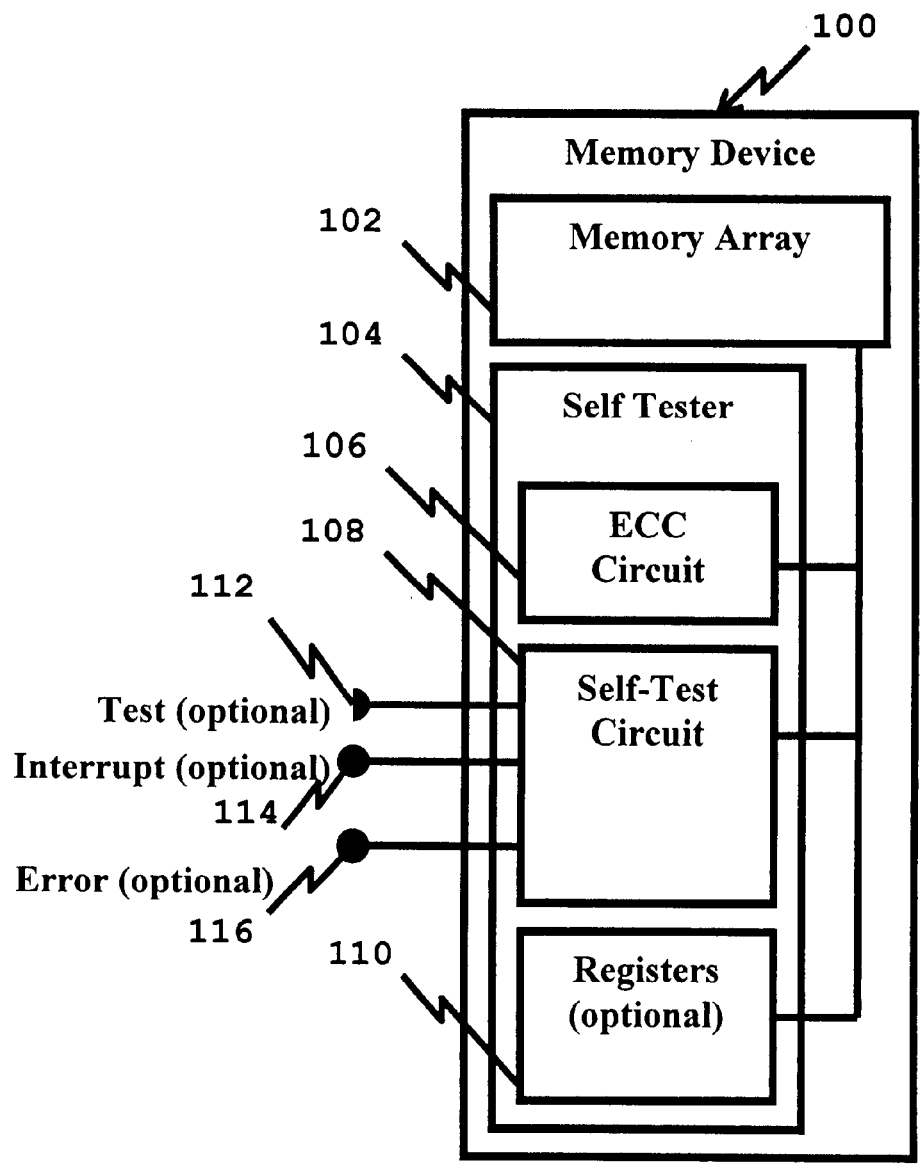
FIG. 1 is a block diagram of a memory device that includes a self-tester.

FIG. 1 is a block diagram of a memory device 100 that includes a memory array 102 and a self-tester 104. The memory array 102 may include flash memory cells, DRAM memory cells, SRAM memory cells, or other types of memory cells. In an embodiment, the memory array 102 is divided into pages of memory cells.

The self-tester 104 is an integrated and automated test controller that may include an ECC circuit 106, a self-test circuit 108 and optional registers 110. The self-tester 104 tests the entire memory array 102 and reports if any errors were detected. The self-tester 104 may optionally correct the detected error(s). Optionally, the self-tester 104 may test the memory array by perform a test on each memory cell one time or multiple times. For example, the self-tester 104 may test the memory array 102 by performing a read test on the memory cells sequentially then repeating the read test or the self-tester 104 may test each group of memory cells twice before testing the next group of memory cells. A loop count or cycle count can be programmed into the registers 110 indicating the number of loops to be performed. The number of test loops actually performed may also be stored in the registers 110, such that when an error is detected the number of test loops that have been performed can easily be determined. The test may optionally skip memory cells, groups, pages that are known to have a defect. When an error is detected, the test may be terminated or continued. If the test continues after an error is detected, an error count may be calculated and stored in a register 110 or transmitted from the self-tester 104. Since the self-tester 104 performs the tests autonomously, the self-tester 104 is preferably internally clocked and requires no interaction with devices external to the memory device 100. In one embodiment, the internal clock rate can be greater than the clock rate used for external reads or writes.

It is preferred that the test be a quick test that can be performed on the memory array 102 while the memory array 102 contains data and that the data is not lost due to the testing, such as a read test. Alternatively, a write-read test, a read-write-read test, or other test may be performed. The self-tester 104 may optionally disable external access to the memory array 102 during the test. In one embodiment, the self-tester 104 accesses the memory array 102 using a wider data path to increase the speed of the test. In another embodiment, the self-tester 104 accesses the memory array 102 using a clock that is faster than the external clock that is used for normal memory reads and writes.

The ECC circuit 106 checks the memory array for errors and optionally repairs any detected error. The ECC circuit 106 may operate autonomously or under the control of the self-test circuit 108. The ECC circuit 106 preferably checks the memory array 102 on a group-by-group basis where the memory array 102 is divided into memory pages that are subdivided into groups. The ECC circuit 102 may use one or more error detection methods to determine if an error has occurred. For example, a cyclic redundancy check (CRC) using a Reed-Solomon algorithm may be used.

In one embodiment, the memory array 102 is tested sequentially one group at a time. Alternative, the memory array 102 may be tested following a non-sequential pattern such as a random or pseudorandom pattern. Other testing patterns can also be used such as testing each group sequentially but running the test several times on each group before proceeding to the next group. Once an error is detected, that memory cell or group can optionally be omitted from subsequent testing. Other variations and combinations of tests can also be used to test the memory array 102.

The self-test circuit 108 optionally counts the number of errors detected by the ECC circuit 106 and stores the error count in one of the registers 110. The self-test circuit 108 may control the ECC circuit 106 such that the self-test circuit 108 initiates and terminates the testing. The self-test circuit 108 and ECC circuit 106 may be a single integrated device.

The self-tester 104 may have various external interfaces, for example, "Test," "Interrupt," and "Error" signals are received at optional interface nodes 112, 114, and 116, respectively. In one embodiment, the interfaces nodes 112 and 114 are connected with the self-test circuit 108. The "Test" signal may be an input signal that initiates a memory test and/or the "Test" signal may be an output signal that indicates the memory test is completed. Alternatively, the self-tester 104 may be initiated after a threshold number of memory accesses have occurred. For example, the self-tester 104 may be initiated after a million memory cells in the memory array 102 have been read or written. In other alternatives, the self-tester 104 may be initiated periodically, after a timer times out, after the memory array is powered-on, after the memory array is reset, or any combination of the initiation mechanisms.

The Ready/Busy signal, also called the "Ready" signal, is an output signal that indicates when the memory is available, "Ready," and when the memory array is unavailable, "Busy." The self-tester 104 can lower the Ready/Busy signal to indicate a test is in progress then raise the signal once the test has terminated. In an embodiment that includes such a Ready/Busy signal, the Ready/Busy signal may be used to measure the duration of the test.

The optional "Interrupt" signal is received at interface nodes 114 and may interrupt the self-tester 104 during a memory test. The "Interrupt" signal can be used as a timeout mechanism to stop a memory test. In another embodiment, the Test, Interrupt, and Ready/Busy signals are received and transmitted at a single interface node. A timeout mechanism can be used in conjunction with or in place of the Interrupt signal. The timeout mechanism would terminate the testing after a timeout threshold is reached.

Figure 2:
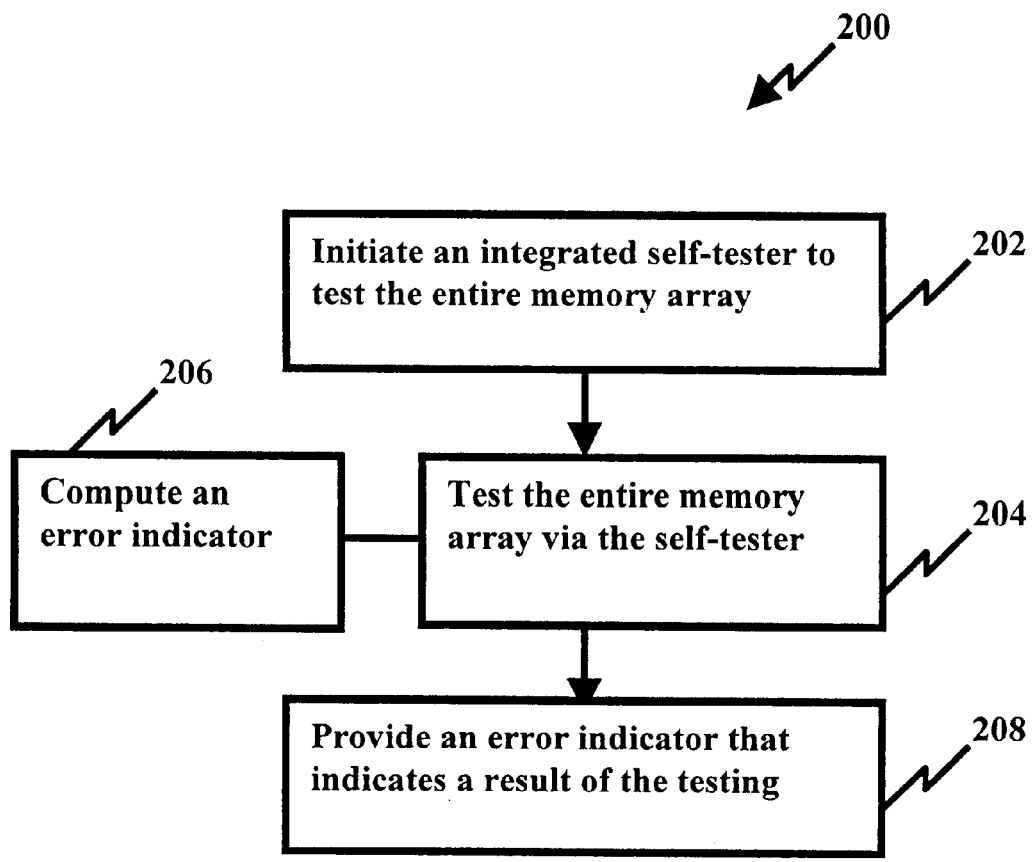
FIG. 2 is a flow diagram of a method of self-testing a memory device.

FIG. 2 is a flow diagram of a method 200 of testing a memory device. In 202, the self-tester initiates a test of the entire memory array.

In 204, each memory cell in the memory array 102 (FIG. 1) is tested. One such test is the read test that is performed sequentially across the entire memory array. The test may be performed by an ECC circuit 106 (FIG. 1). The test may be terminated if an error is detected or the entire memory array may be tested regardless if an error is detected.

In 206, an error indicator is generated. The number of errors detected may be counted or an error flag can be set to indicate that at least one error was detected. Optionally, the detected errors may be corrected.

In 208, an indication that an error was detected optionally can be provided external to the memory device via an error signal. Alternatively, the error indication may be stored in an internal register 110 for later access by external test equipment.

While preferred embodiments have been shown and described, it will be understood that they are not intended to limit the disclosure, but rather it is intended to cover all modifications and alternative methods and apparatuses falling within the spirit and scope of the invention as defined in the appended claims or their equivalents.

What is claimed is:

1. A method of self-testing a memory device comprising:
   testing an entire memory array via an internal self-test including;
      accessing the memory array using a wide self-test data path;
      clocking the access of the memory array using an internal clock rate; and
      read error checking and correcting;
   detecting an error; and
   generating an error indicator as a function of the detecting the error; and
   wherein testing the entire memory array and generating the error indicator are initiated after a threshold number of accesses to the memory array have occurred and are performed autonomously once initiated.

2. The method of claim 1, further comprising generating a cycle count representing a number of times testing the entire memory array is performed.

3. The method of claim 1, further comprising providing an external indication of an end of the testing.

4. The method of claim 1, wherein testing the entire memory array and generating the error indicator is initiated after a threshold number of read accesses to the memory array have occurred.

5. The method of claim 1, wherein testing the entire memory array and generating the error indicator is initiated after the memory array is powered on.

6. The method of claim 1, wherein testing the entire memory array and generating the error indicator is initiated after a memory reset is received.

7. The method of claim 1, wherein the memory array is comprises a plurality of memory pages and each memory page is dividable into a plurality of groups, and wherein testing the entire memory array further comprises testing the memory on a group-by-group basis.

8. The method of claim 7, wherein the testing the entire memory array is performed on a group-by-group bases with a pseudorandom pattern.

9. The method of claim 1, wherein testing the entire memory array further comprises performing read and write operations on each memory cell in the memory array.

10. The method of claim 1, wherein testing the entire memory array further comprises performing read operations on each memory cell in the memory array.

11. The method of claim 10, wherein the memory array comprises an array of flash memory cells.

12. The method of claim 1, wherein testing the entire memory array is terminated when an error is detected.

13. The method of claim 1, wherein testing the entire memory array further comprises omitting a memory cell that is known to be defective.

14. The method of claim 1, wherein testing the entire memory array occurs when memory cells in the memory array contain data and the data is unchanged after the testing.

15. The method of claim 1, wherein the wide self-test data path further comprises a double-wide data path.

16. A memory device comprising:
a memory array;
a self-tester including;
a self-test circuit that performs a test on each memory cell in the memory array and providing a result of the test;
an internal clock that controls a rate of the test, wherein a first clock rate of the internal clock is higher than a second clock rate that is used for external reads of the memory array; and
a wide self-test data path coupling the self-test circuit to the memory array.

17. The memory device of claim 16, wherein the self-tester autonomously tests each memory cell of the memory array.

18. The memory device of claim 17, wherein the self-tester tests the memory cells with a write-read test.

19. The memory device of claim 16, wherein the self-tester tests each memory cell of the memory array sequentially.

20. The memory device of claim 19, wherein the self-tester tests a group of memory cells of the memory array at a time.

21. The memory device of claim 19, wherein the self-tester terminates the test if an error is detected.

22. The memory device of claim 19, wherein the self-tester omits a memory cell that is defective.

23. The memory device of claim 19, wherein the self-tester tests the memory cells when the memory cells contain data and the data is unchanged after the test.

24. The memory device of claim 23, wherein the wide self-test data path comprises a double-wide data path.

25. The memory device of claim 24, wherein the self-tester disables external access to the memory array during tests.

26. The memory device of claim 25, wherein the self-test circuit tests the memory array after a threshold number of accesses to the memory cells of the memory array.

27. The memory device of claim 25, wherein the self-test circuit tests the memory array after a threshold period of time has passed.

28. The memory device of claim 25, wherein a result of the test is stored in a status register.

29. The memory device of claim 25, wherein the self-tester stops the test when an interrupt line is toggled.

30. The memory device of claim 23, wherein the self-test circuit tests the memory array after the memory device is powered on.

31. The memory device of claim 16, wherein the self-tester further comprises an error checking and correcting circuit coupled to the memory array and the self-test circuit by the wide self-test data path that corrects a detected error.

32. A method of self-testing a memory device comprising:
testing an entire memory array via an internal self-test, including;
accessing the memory array using a double-wide data path;
clocking the access of the memory array using an internal clock rate; and
read error checking and correcting;
detecting an error; and
generating an error indicator as a function of the detecting the error; and
wherein testing the entire memory array and generating the error indicator are performed autonomously once initiated.

33. The method of claim 32, further comprising generating a cycle count representing a number of times testing the entire memory array is performed.

34. The method of claim 32, further comprising providing an external indication of an end of the testing.

35. The method of claim 32, wherein testing the entire memory array and generating the error indicator is initiated after a threshold number of read accesses to the memory array have occurred.

36. The method of claim 32, wherein testing the entire memory array and generating the error indicator is initiated after the memory array is powered on.

37. The method of claim 32, wherein testing the entire memory array and generating the error indicator is initiated after a memory reset is received.

38. The method of claim 32, wherein the memory array is comprises a plurality of memory pages and each memory page is dividable into a plurality of groups, and wherein testing the entire memory array further comprises testing the memory on a group-by-group basis.

39. The method of claim 38, wherein the testing the entire memory array is performed on a group-by-group bases with a pseudorandom pattern.

40. The method of claim 32, wherein testing the entire memory array further comprises performing read and write operations on each memory cell in the memory array.

41. The method of claim 32, wherein testing the entire memory array further comprises performing read operations on each memory cell in the memory array.

42. The method of claim 41, wherein the memory array comprises an array of flash memory cells.

43. The method of claim 32, wherein testing the entire memory array is terminated when an error is detected.

44. The method of claim 32, wherein testing the entire memory array further comprises omitting a memory cell that is known to be defective.

45. The method of claim 32, wherein testing the entire memory array occurs when memory cells in the memory array contain data and the data is unchanged after the testing.

* * * * *